(12) United States Patent
Toyama et al.

(10) Patent No.: US 7,233,489 B2
(45) Date of Patent: Jun. 19, 2007

(54) MEMORY CARD DRIVE AND PORTABLE MEMORY CARD DRIVE

(75) Inventors: Katsumi Toyama, Kanagawa (JP); Kiyoshi Omori, Tokyo (JP); Michihiko Iida, Kanagawa (JP)

(73) Assignee: Sony Corporation, Tokyo (JP)

( * ) Notice: Subject to any disclaimer, the term of this patent is extended or adjusted under 35 U.S.C. 154(b) by 492 days.

(21) Appl. No.: 10/024,162

(22) Filed: Dec. 18, 2001

(65) Prior Publication Data

US 2002/0078297 A1 Jun. 20, 2002

(30) Foreign Application Priority Data

Dec. 20, 2000 (JP) .................... P2000-391842

(51) Int. Cl.
*H05K 5/00* (2006.01)
*G06F 13/00* (2006.01)
(52) U.S. Cl. .................. 361/684; 361/752; 361/685; 711/115
(58) Field of Classification Search ........... 361/684, 361/752, 685; 711/115
See application file for complete search history.

(56) References Cited

U.S. PATENT DOCUMENTS

| | | | | |
|---|---|---|---|---|
| 5,305,182 A | * | 4/1994 | Chen | 361/684 |
| 5,524,104 A | * | 6/1996 | Iwata et al. | 720/652 |
| D374,236 S | * | 10/1996 | Grewe et al. | D14/299 |
| 5,563,400 A | * | 10/1996 | Le Roux | 235/486 |
| 5,625,608 A | * | 4/1997 | Grewe et al. | 369/24.01 |
| 5,933,328 A | * | 8/1999 | Wallace et al. | 361/737 |
| 6,493,239 B2 | * | 12/2002 | Ando et al. | 361/796 |
| 6,681,276 B1 | * | 1/2004 | Jeong et al. | 710/72 |
| 2001/0004339 A1 | * | 6/2001 | Ishida et al. | 369/37 |
| 2003/0130043 A1 | * | 7/2003 | Blake, Jr. | 463/46 |

* cited by examiner

*Primary Examiner*—Lisa Lea-Edmonds
*Assistant Examiner*—Zachary Pape
(74) *Attorney, Agent, or Firm*—Oblon, Spivak, McClelland, Maier & Neustadt, P.C.

(57) ABSTRACT

A memory card drive is provided which can record a large amount of digital information. A plurality of memory card slots is provided in a memory card drive body having a memory interface. A plurality of memory cards is detachably accommodated in the memory card slots. Digital information is recorded into and played back from the memory cards through the memory interface.

5 Claims, 11 Drawing Sheets

MEMORY CARD DRIVE AND PORTABLE MEMORY CARD DRIVE

BACKGROUND OF THE INVENTION

1. Field of the Invention

The present invention relates to a memory card drive and a portable memory card drive which can record (write) and playback (read) digital information into and from memory cards.

2. Description of the Related Art

Conventionally, a memory card, which is a card-type recording medium such as a memory stick, in which a flash memory is incorporated, has been widely applied to digital equipment including a personal computer, digital camera, disk drive, pet robot, portable telephone, etc., due to its small-size, low-profile shape, and versatility.

In general, in such digital equipment, a slot for the insertion of the memory card is formed, so that the memory card inserted is electrically connected with the digital equipment and energized to record (write) and playback (read) digital information into and from the memory card.

However, for recording a large amount of digital information, a single memory card has a disadvantage such as a need for replacing the memory card with another one, due to its small storage capacity.

SUMMARY OF THE INVENTION

Accordingly, the present invention has been made to overcome the problem mentioned above, and an object thereof is to provide a memory card drive and a portable memory card drive which can record a large-amount of digital information.

To this end, according to a first aspect of the present invention, there is provided a memory card drive. The memory card drive includes a memory card drive body having a memory interface, and a plurality of memory card slots provided in the memory card drive body. A plurality of memory cards is detachably accommodated in the memory card slots, and digital information is recorded into and played back from the memory cards through the memory interface.

According to a second aspect of the present invention, there is provided a portable memory card drive. The portable memory card drive includes a portable memory card drive body having a memory interface, and a plurality of memory card slots provided in the portable memory card drive body. A plurality of memory cards is detachably accommodated in the memory card slots, and digital information is recorded into and played back from the memory cards through the memory interface.

The memory card drive according the first aspect of the present invention enables a plurality of memory cards to be detachably accommodated in the memory card drive body, such that digital information can be recorded into and played back from the memory cards through the memory interface. Consequently, the storage capacity can be virtually augmented in proportion to the number of memory cards accommodated. The present invention, therefore, can provide a portable apparatus that allows continuous recording and playback for an extended period of time, without replacing the memory cards.

The portable memory card drive according to the second aspect of the present invention enables a plurality of memory cards to be detachably accommodated in the portable memory card drive body, such that digital information can be recorded into and played back from the memory cards through the memory interface. Consequently, the storage capacity can be virtually augmented in proportion to the number of the memory cards accommodated. The present invention, therefore, can provide a portable apparatus that allows continuous recording and playback without replacing the memory cards. In addition, the present invention can provide a portable apparatus that allows continuous recording and playback while being carried and/or where away from home.

DESCRIPTION OF THE PREFERRED EMBODIMENTS

A memory card drive and a portable memory card drive according to the present invention will be described below in connection with exemplary embodiments and modifications.

Figure 13A:
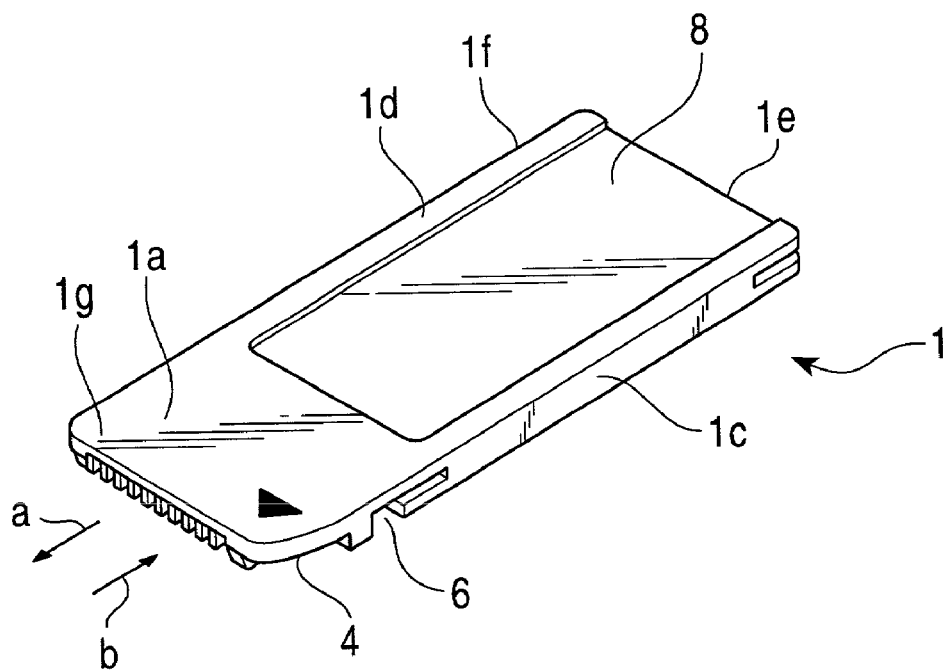
FIGS. 13A and 13B are perspective views of upper and bottom surfaces of a memory card, respectively.
Figure 13B:
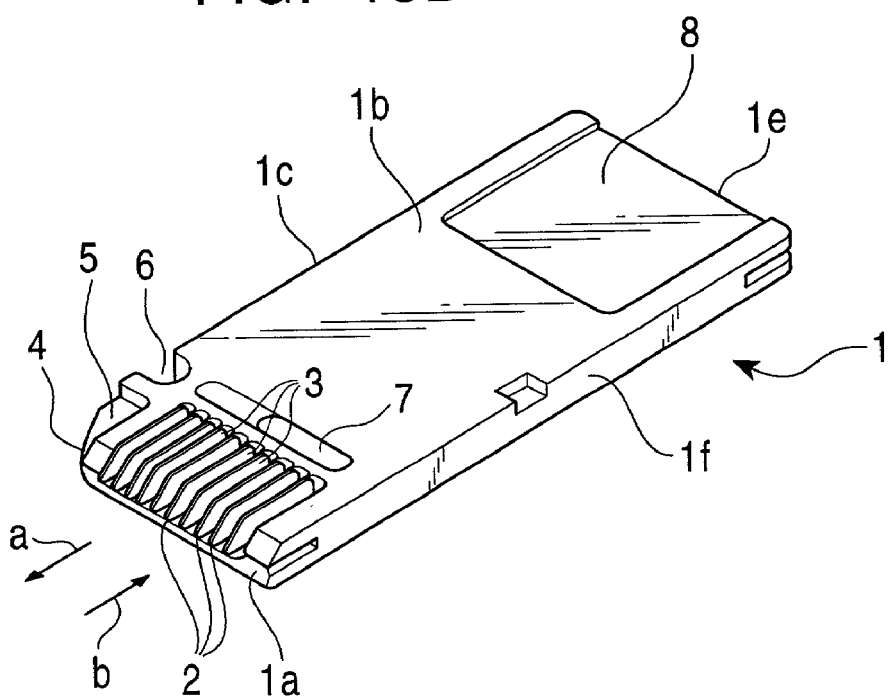

A memory card, such as a memory stick, in the form of a card-type recording medium will now be described with reference to FIGS. 13A and 13B. A memory card 1, which is of the PCMCIA standard, is flat, rectangular, and substantially card-shaped just like a stick of chewing gum. The memory card 1 is inserted into and removed from electronic equipment in the direction of the arrows a and b, respectively. As shown in FIG. 13B, the memory card 1 has, at the bottom surface 1b of the front end 1a, a series of substantially strip-shaped terminals 2 that are arranged at regular intervals in a direction perpendicular to the arrows a and b. A plurality of thin ribs 3 is arranged to provide a partition between the terminals 2. The terminals 2 at both ends are designated as ground terminals, and the other terminals 2 are designated as signal terminals. The memory card 1 has a rounded surface 4 formed at the front end 1*a* of the side surface 1*c*, which is the left surface (in FIG. 13A) viewed from the insertion direction (in the direction of the arrow a), for preventing the memory card 1 from being improperly inserted. As shown in FIG. 13B, the memory card 1 also has a step 5 formed on the bottom surface 1*b*, that is, at a position substantially corresponding to the bottom portion of the rounded surface 4 of the front end 1*a*, for preventing the memory card 1 from being improperly inserted. A locking recess 6 substantially in the form of a semicircle is formed adjacent to the front end 1*a* of the side surface 1*c*, and a write protector 7 is provided adjacent to the front end 1*a* on the bottom surface 1*b*. Referring to FIGS. 13A and 13B, a tag area 8 for sticking a tag is provided in the form of a shallow groove on both surfaces 1*d* and 1*b* of the memory card 1 via the rear end 1*e*. The right side surface (in FIG. 13A) of the memory card 1, viewed from the insertion direction (in the direction of the arrow a) forms the side surface 1*f*.

Figure 1:
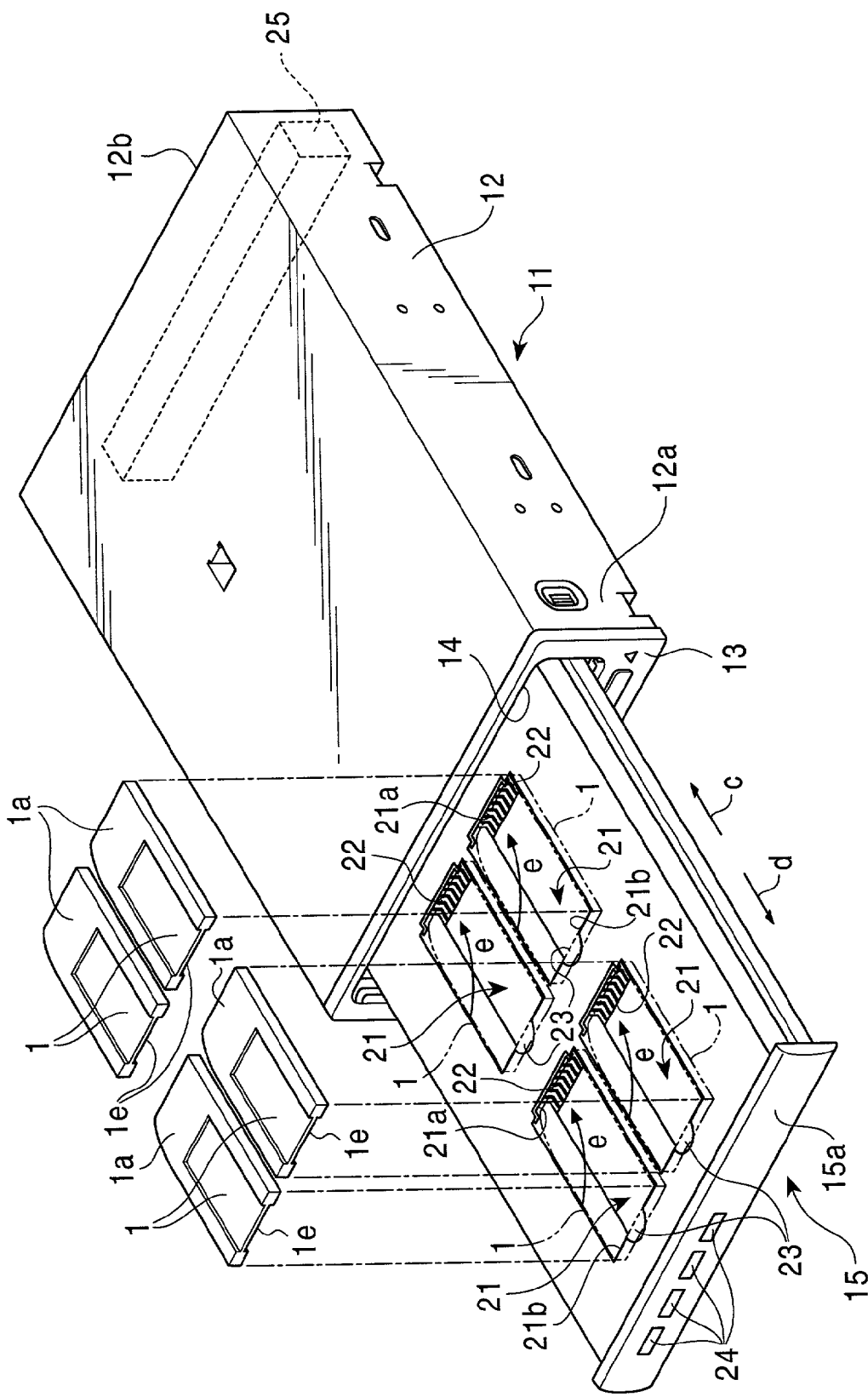
FIG. 1 is a perspective view of a memory card drive according to one embodiment of the present invention, with a memory card tray being ejected.
Figure 2:
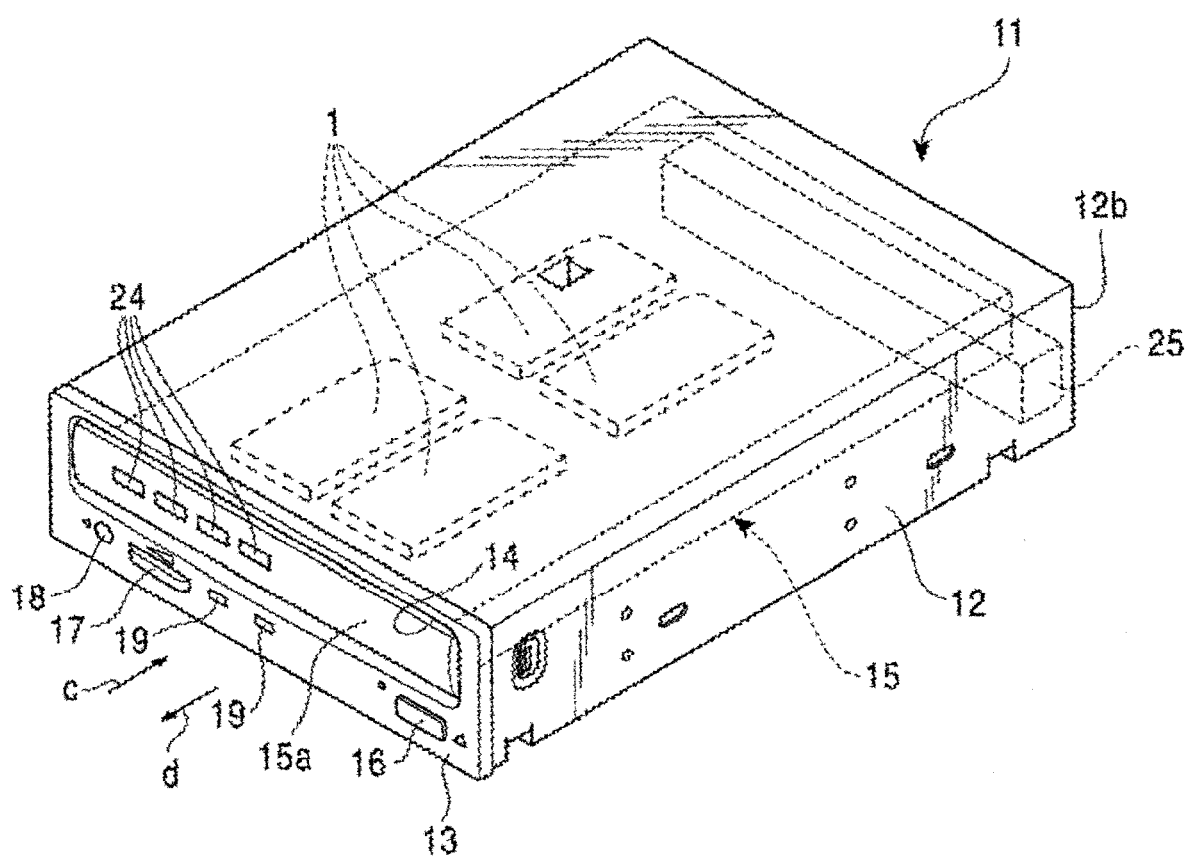
FIG. 2 is a perspective view of the memory card drive according to the embodiment, with the memory card tray being loaded.

A memory card drive according to the present invention will now be described with reference to FIGS. 1 to 4. Referring first to FIGS. 1 and 2, a memory card drive 11 of a tray type is illustrated. A memory card drive body 12 has, at the front end 12*a* thereof, a front panel 13 having an opening for a tray port 14. A memory card tray 15 is provided in the tray port 14, and is driven by a loading mechanism (not shown) so as to eject from and retract into the memory card drive body 12 in the substantially horizontal directions indicated by the arrows c and d. An eject button 16, a volume control 17, a headphone jack 18, and operation indicator LEDs 19 are arranged at a section under the tray port 14 on the front panel 13 of the memory card drive body 12.

The memory card tray 15 is formed of synthetic resin or the like, and has, in the upper surface thereof, a plurality of, for example, four to ten memory card slots 21 formed in parallel and in multiple rows. Each of the memory card slots 21 is formed to be a relatively narrow and shallow groove, which has substantially the same size as the outer dimension of the memory card 1. Each of the memory card slots 21 also has, at the bottom of one end 21*a* thereof, substantially strip-shaped connection terminals 22 arranged in parallel lines. The connection terminals 22 correspond in the number and intervals to the terminals 2 of the memory card 1 described above. A finger insertion recess 23 is formed at the other end 21*b* of each of the memory card slots 21. A locking and unlocking mechanism (not shown) for the memory card 1 is also provided in each of the memory card slots 21. A plurality of, for example, four to ten operation indicator LEDs 24 are arranged on the front panel 15*a* of the memory card tray 15, such that the number of the operation indicator LEDs 24 corresponds to the number of the memory card slots 21.

The memory card drive body 12 has a memory interface 25 of the PCMCIA standard at the rear end 12*b* thereof. The memory interface 25 is connected in parallel and/or series with the connection terminals 22 of each of the memory card slots 21 in the memory card tray 15 through wiring means such as a flexible printed circuit board (not shown).

The operation of the memory card drive 11 will now be described with reference to FIG. 1. As shown, after the memory card tray 15 is ejected from the memory card drive body 12 in the direction of the arrow d, a plurality of memory cards 1 is detachably inserted in the memory card slots 21 as indicated by alternate long and short dashed lines. In this case, each of the memory cards 1 is inserted into the memory card slot 21 with the front end 1*a* being first in a slanting direction as indicated by the arrow e, such that the terminals 2 of the memory card 1 are engaged with the corresponding connection terminals 22. The rear end 1*e* of the memory card 1 is then depressed into the memory card slot 21 so as to be locked with the locking mechanism.

Thereafter, upon the touch of a finger on the front panel 15*a* of the memory card tray 15 to turn on a loading switch (not shown), the memory card tray 15 is retracted into the memory card drive body 12 in the direction of the arrow c, as shown in FIG. 2, by the loading mechanism, so that the memory cards 1 are loaded into the memory card drive body 12.

Thus, various types of digital information, such as audio and video, are transmitted from a processing unit to the memory card drive 11 through the memory interface 25, thus making it possible to record (write) and playback (read) digital information into and from the plurality of memory cards 1.

Thus, the memory card drive 11, which includes a plurality of detachable (replaceable) memory cards 1, can constitute, for example, portable apparatuses such as a portable telephone, digital still camera, video camera, PDA, and audio equipment. The memory card drive 11 can then provide storage capacity that is proportional to the number of the memory cards 1 accommodated therein.

In ejection, pressing the eject button 16 causes the memory card tray 15 to be ejected by the loading mechanism from the memory card drive body 12 in the direction of the arrow d, as shown in FIG. 1, so that the plurality of memory cards 1 can be removed from the memory card drive body 12. In this case, the read end 1*e* of each of the memory cards 1 is lifted with a finger inserted into the finger insertion recess 23 at the rear end of the memory card slot 21, so that the memory card 1 can be easily pulled out of the memory card slot 21 in the opposite direction to the arrow e. Thus, this arrangement can facilitate, for example, replacement of the memory cards 1.

Figure 3:
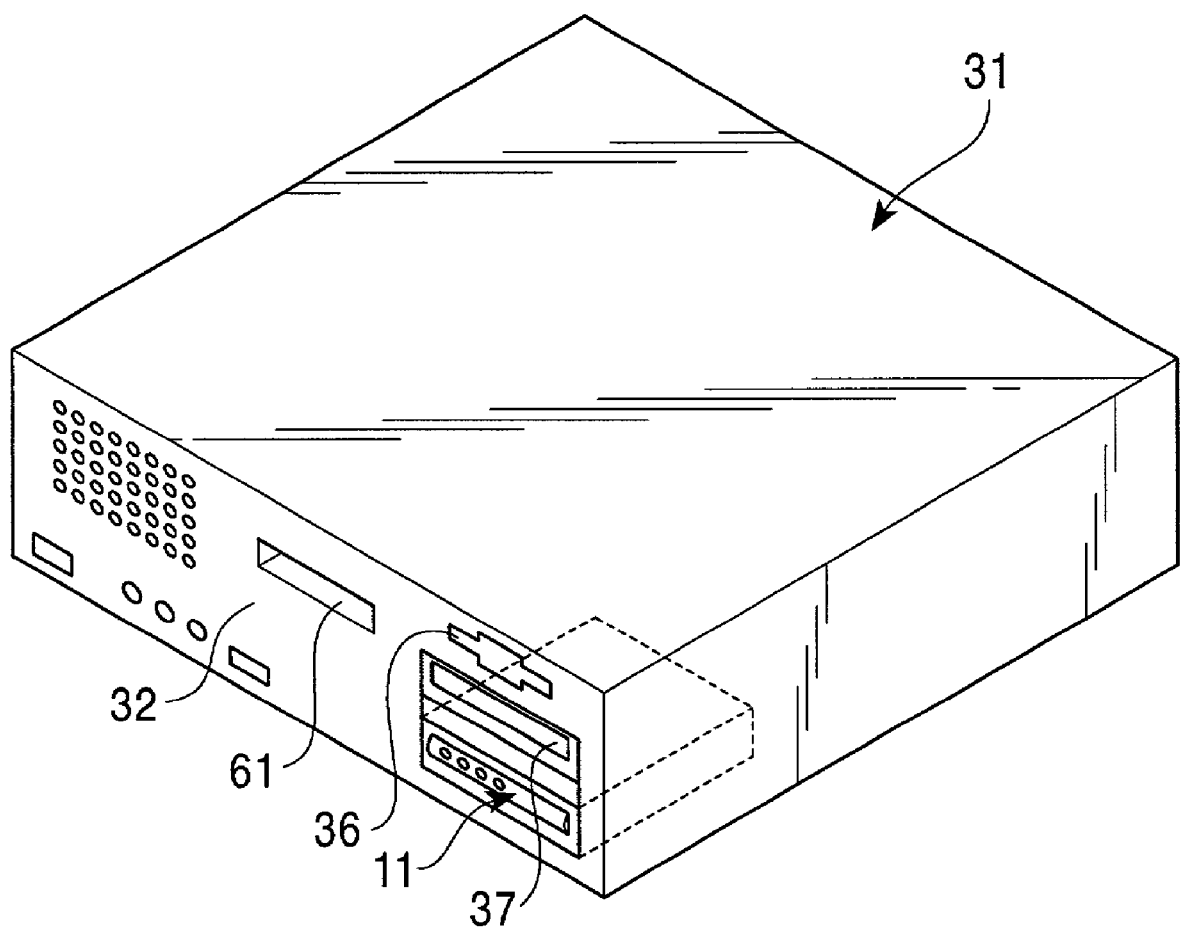
FIG. 3 is a perspective view of a personal computer.
Figure 4:
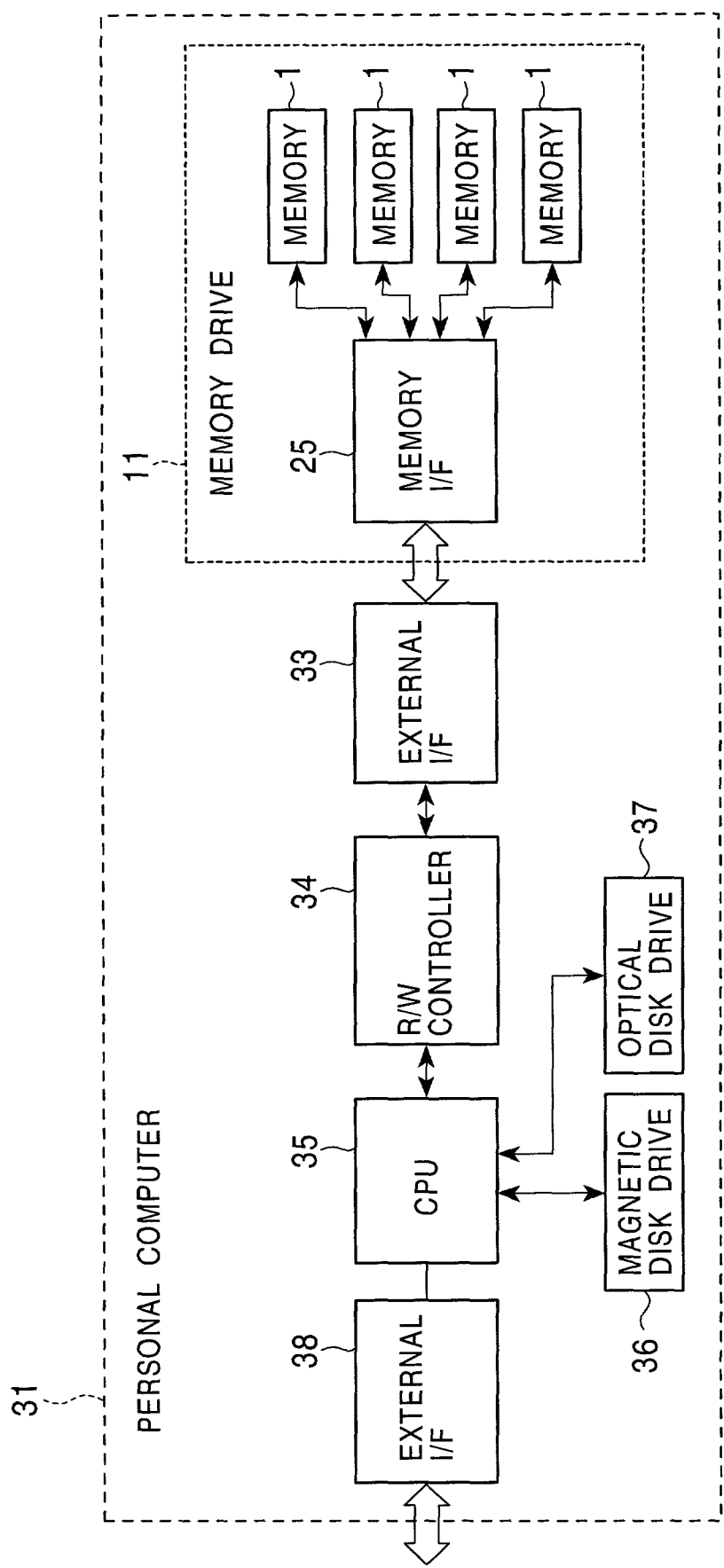
FIG. 4 is a schematic block circuit diagram of the personal computer.

Referring now to FIGS. 3 and 4, the memory card drive 11 is installed in a front panel 32 of a personal computer 31 for use as a host computer. The memory card drive 11 is connected to an external interface 33, which is of the PCMCIA standard, within the personal computer 31, and is then connected to a processing unit 35 through a read/write controller 34. Similarly, a magnetic disk drive 36 such as a floppy disk drive, an optical disk drive 37 such as a CD, CD-R, CD-RW, DVD, DVD-RAM, or DVD-RW, and a hard disk drive (not shown) which are installed in the front panel 32 or within the personal computer 31 are connected to the processing unit 35. The personal computer 31 is in turn connected to a telephone line and other various kinds of digital equipment terminals such as, a video camera and television set, through an external interface 38.

The processing unit 35 of the personal computer 31 controls the read/write controller 34 to supply the power to the memory cards 1 of the memory card drive 11 through the external interface 33 and the memory interface 25. Thus, the processing unit 35 can sequentially and/or selectively record and playback various information into and from the memory cards 1, such as audio and video input from the magnetic disk drive 36, the optical disk drive 37, or the hard disk drive, or through the external interface 38. With this arrangement, therefore, it is possible to perform continuous recording and playback for an extended period of time, without frequently replacing the memory cards 1.

A portable memory card drive according to one embodiment of the present invention will now be described with reference to FIGS. 5 to 12. As shown in FIGS. 5 to 8, a portable memory card drive 41 is designed to be compact and substantially flat, and can constitute portable apparatuses such as a portable telephone, digital still camera, video camera, PDA, and audio equipment. The portable memory card drive 41 is configured to be a tray type, in which a flat memory card tray 43 is loaded and unloaded through the front end 42*a* in a low-profile portable memory card drive body 42 in the directions of the arrows c and d.

The memory card tray 43 has, at the top thereof, a plurality of, for example, two to four memory card slots 21 as described above, which are formed in parallel (and/or in two rows, for example). As in the manner discussed above, each of the memory card slots 21 has the connection terminals 22 arranged at the bottom of the one end 21*a*, and also has the finger insertion recess 23 formed at the other end 21*b*. The memory card drive body 42 also has a memory interface 25, which is similar to the one described above, at the rear end 42*b* thereof. The memory interface 25 is connected with the connection terminals 22 of each of the memory card slots 21 through wiring means such as a flexible printed circuit board (not shown).

The memory card drive body 42 of the portable memory card drive 41 includes a power supply containing a plurality of batteries 44, such as AA batteries, or C-size batteries. Thus, the inclusion of the batteries 44 therein achieves the portability of the portable memory card drive 41. In addition, various switches, including a power switch 45, memory card selector switch 46, a play switch 47, a headphone jack 48, a volume control 49, and operation indicator LEDs 50, are arranged, for example, at the side surface 42*c* of the memory card drive body 42 and the front end 43*a* of the memory card tray 43 of the portable memory card drive 41.

Figure 5:
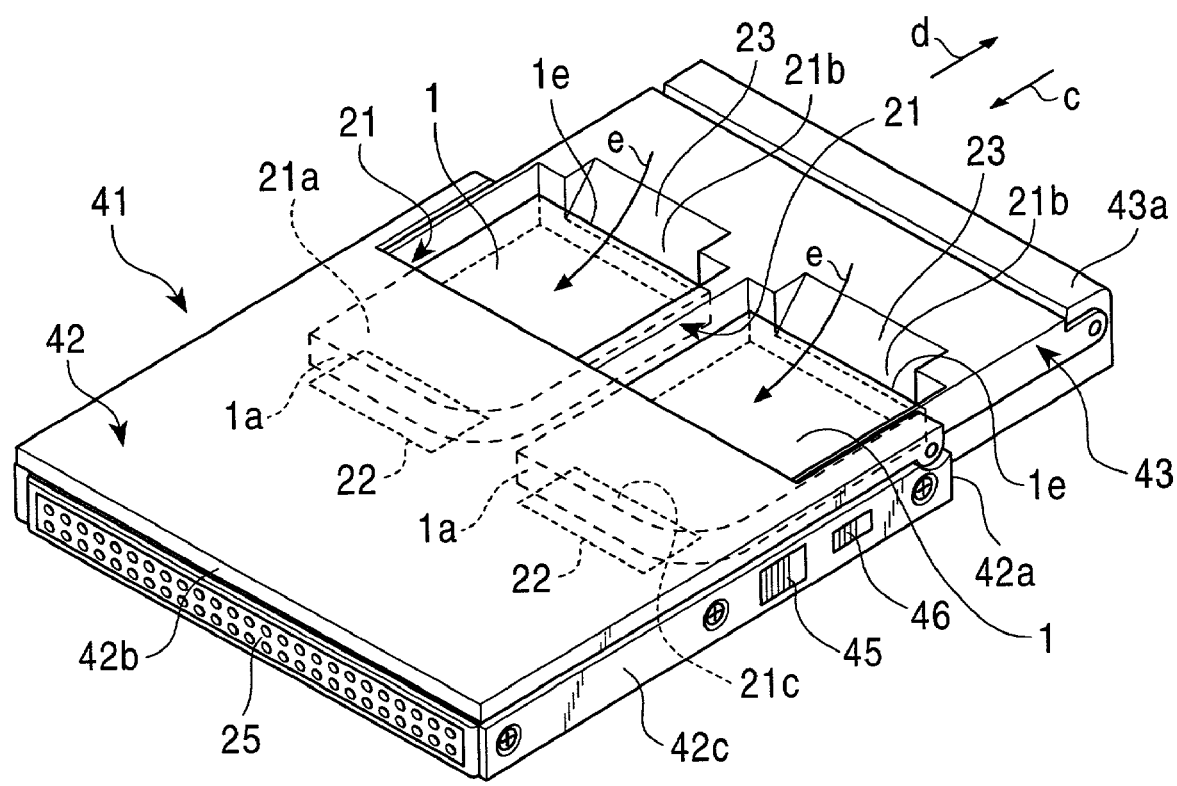
FIG. 5 is a perspective view of a portable memory card drive according to one embodiment of the present invention, with a memory card tray being ejected.

The operation of the portable memory card drive 41 will now be described with reference to FIG. 5. As shown, first, the front end 43*a* is held with a hand and the memory card tray 43 is pulled out from the memory card drive body 42 in the direction of the arrow d. As in the same manner described above, each of the memory cards 1 is inserted into the memory card slot 21 with the front end 1*a* being first in the direction of the arrow e, such that the terminals 2 of the memory card 1 are engaged with the corresponding connection terminals 22. The memory card 1 is then locked within the memory card slot 21. Thus, each of the memory cards 1 is accommodated in a detachable (replaceable) manner in the memory card tray 43.

Figure 6:
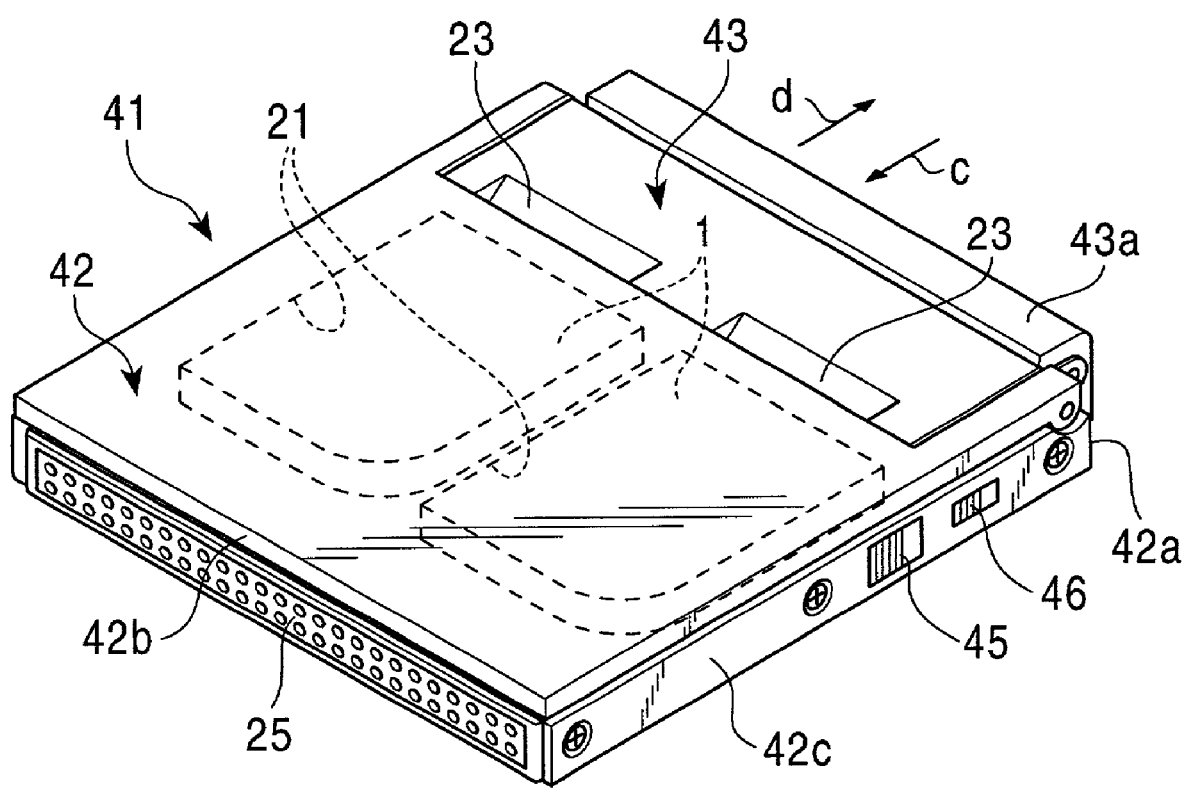
FIG. 6 is a perspective view of the portable memory card drive according to the embodiment, with the memory card tray being loaded.
Figure 7:
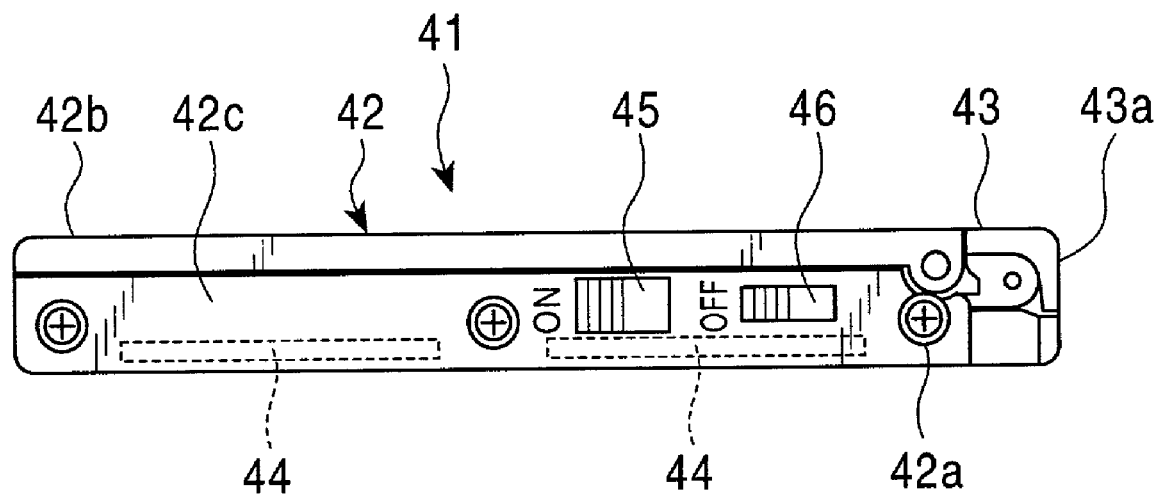
FIG. 7 is a side view of the portable memory card drive according to the embodiment.
Figure 8:
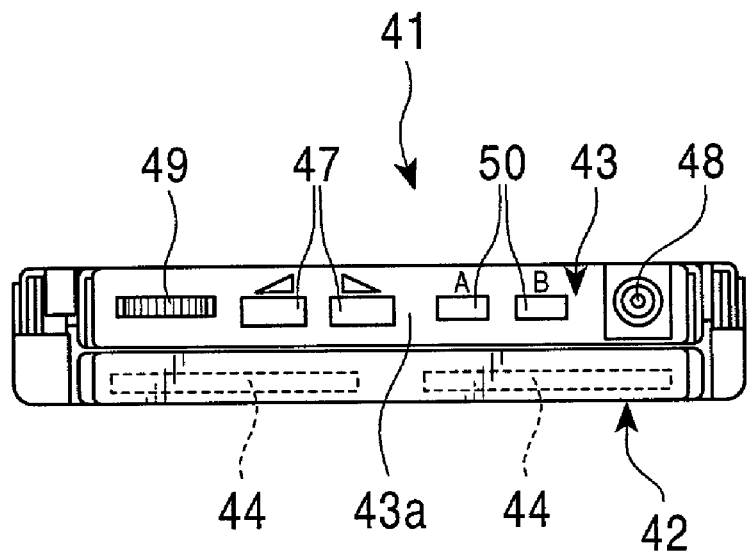
FIG. 8 is a front view of the portable memory card drive according to the embodiment.

Thereafter, as shown in FIGS. 6 to 8, the memory card tray 43 is pushed into the memory card drive body 42 in the direction of the arrow c, so that the memory cards 1 are loaded in the memory card drive body 42. This portable memory card drive 41 can then be carried freely in a pocket or a bag.

When away from home, plugging a headphone or the like into the headphone jack 48 and turning on the power switch 45 causes power supply of the batteries 44 to be provided to the memory cards 1. Additionally, switching the memory cards 1 using the memory card selector switch 46 and operating the play switch 47 allows selective and/or continuous playback of audio information or the like recorded in the plurality of memory cards 1. With this portable memory card drive 41, therefore, it is possible to constitute portable apparatuses such as a portable telephone, digital still camera, video camera, PDA, and audio equipment.

Referring back to FIG. 3, a slot 61 for the insertion of the portable memory card drive 41 may be formed in the front panel 32 of the personal computer 31. The portable memory card drive 41 is inserted with the rear end 42*b* being first put into the slot 61. The portable memory card drive 41 is then connected with the read/write controller 34, shown in FIG. 4, of the personal controller 31 through the memory interface 25. The processing unit 35 of the personal computer 31 controls the power supply for the portable memory card drive 41 through the read/write controller 34, such that digital information such as audio and video is continuously recorded into and played back from the memory cards 1.

Figure 9:
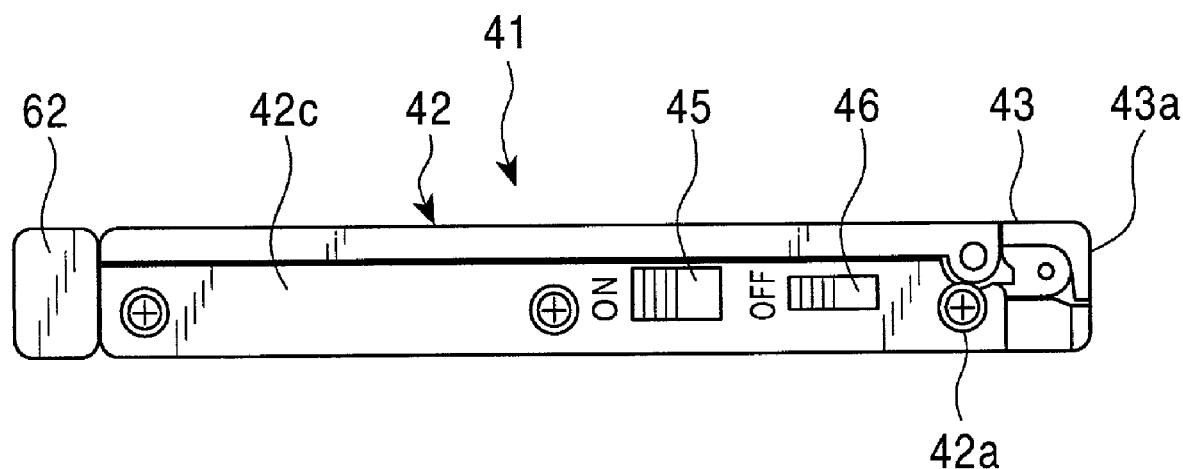
FIG. 9 is a side view of a first modification of the portable memory card drive.

Referring to FIG. 9, the portable memory card drive 41 according to a first modification is illustrated. This portable memory card drive 41 uses, as the power supply, a battery pack 62 that is detachably attached to, for example, the memory interface 25.

Figure 10:
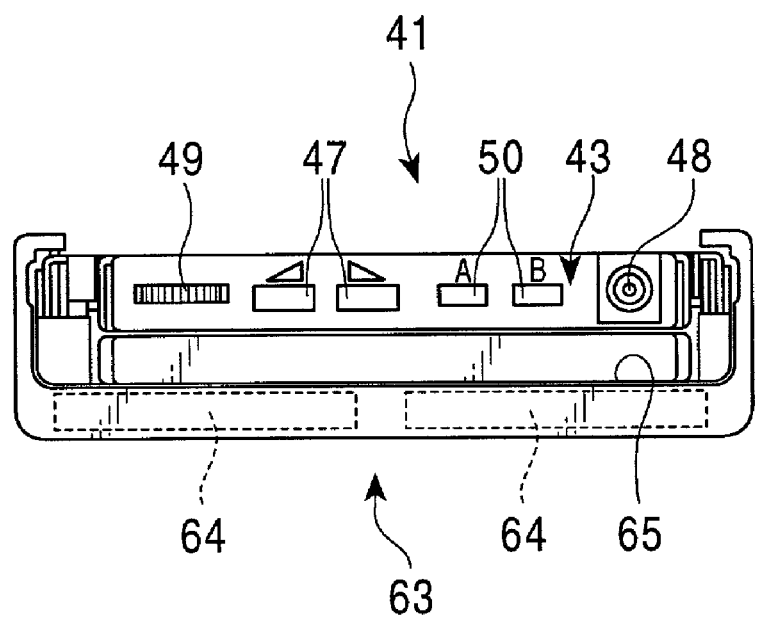
FIG. 10 is a front view of a second modification of the portable memory card drive.

Referring to FIG. 10, the portable memory card drive 41 according to a second modification is illustrated. This portable memory card drive 41 uses a portable holder 63 containing a plurality of high-capacity batteries 64. In this modification, rather than including a power supply in the memory card drive 41 itself, the portable holder 63, which is made of synthetic resin or the like, contains the high-capacity batteries 64, such as chewing-gum batteries, AA batteries, or the like. The portable memory card drive 41 is inserted with the memory interface 25 being first put into a drive holding portion 65 of the portable holder 63, such that the memory interface 25 is connected with a connector (not shown) of the portable holder 63. Thus, this arrangement allows large-capacity power to be supplied to the portable memory card drive 41 from the plurality of batteries 64.

Figure 11:
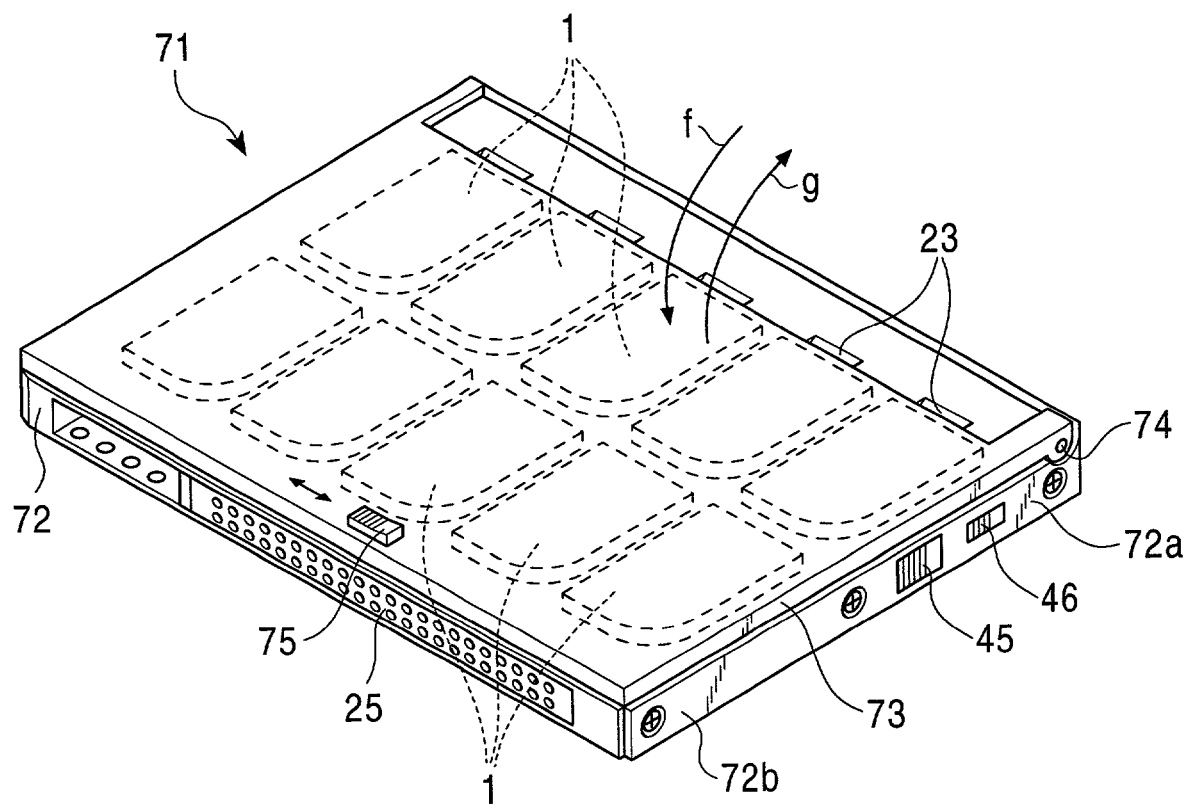
FIG. 11 is a perspective view of a portable memory card drive according to a third modification, with an opening/closing cover being closed.
Figure 12:
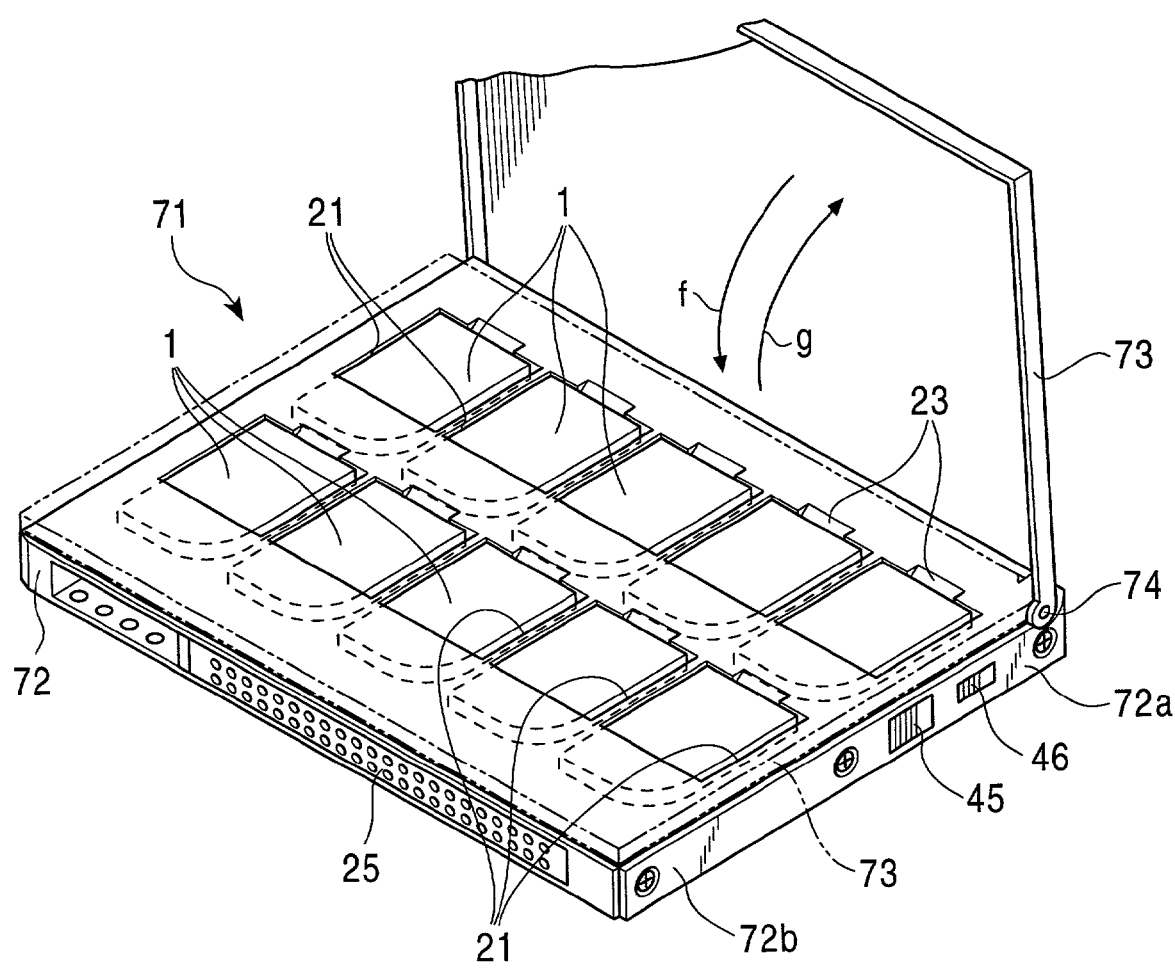
FIG. 12 is a perspective view of the portable memory card drive according to the third modification, with the opening/closing cover being open.

Referring to FIGS. 11 and 12, a portable memory card drive 71 according to a third modification is illustrated. This portable memory card drive 71 employs an opening/closing cover method. In the portable memory card drive 71, an opening/closing cover 73 is pivotally attached to the front end 72*a* of the memory card drive body 72 via a pair of pivot pins 74 at both ends. Thus, the opening/closing cover 73 pivotally moves between an open position and a closed position in the substantially vertical direction indicated by the arrows f and g.

In this modification, a number of the memory card slots 21 are formed in parallel and in multiple rows so that, for example, 10 to 20 memory cards 1 can be accommodated in a detachable (replaceable) manner in the memory card drive body 72.

In operation, as shown in FIG. 12, after the opening/closing cover 73 is opened in the direction of the arrow g, the memory cards 1 are accommodated in the memory card slots 21 of the memory card drive body 72 in a detachable (replaceable) manner. Subsequently, as shown in FIG. 11, the opening/closing cover 73 is moved in the direction of the arrow f into the closed position in which the opening/closing cover 73 covers the memory cards 1. The opening/closing cover 73 is then locked with the locking tab 75, so that the portable memory card drive 71 can be carried about.

While the present invention has been described in connection with particular embodiments and modifications, the present invention is not limited thereto. Various changes can be made thereto without departing from the spirit and scope of the present invention. For example, a detachable cover may be used.

What is claimed is:

1. A portable memory card drive, comprising:
    a portable memory card drive body configured to be inserted into a portable memory card drive slot of a personal computer and to connect to an external interface of the personal computer after insertion;
    a memory interface configured to allow the memory card drive to send and receive digital information to and from the personal computer;

a plurality of memory card slots provided in said portable memory card drive body oriented in a planar array to accept a plurality of memory cards in the same loading orientation; and a memory card selector switch configured to select among the plurality of memory card slots, wherein said portable memory card drive body includes a power supply.

2. A portable memory card drive according to claim 1, wherein the power supply is at least one battery that is included in said portable memory card drive body.

3. A portable memory card drive according to claim 1, wherein the power supply is a battery pack that is detachably attached to said portable memory card drive body.

4. A portable memory card drive according to claim 1, wherein the power supply is at least one battery that is included in a portable holder detachably attached to said portable memory card drive body.

5. A portable memory card drive, comprising:

a portable memory card drive body configured to be inserted into a portable memory card drive slot of a personal computer and to connect to an external interface of the personal computer after insertion;

a memory interface configured to allow the memory card drive to send and receive digital information to and from the personal computer;

a plurality of memory card slots provided in said portable memory card drive body oriented in a planar array to accept a plurality of memory cards in the same loading orientation;

a memory card selector switch configured to select among the plurality of memory card slots; and an opening/closing cover pivotally attached to said portable memory card drive body for movement between an open position, in which the memory cards are exposed, and a closed position, in which said opening/closing cover covers the memory cards.

\* \* \* \* \*